(12) United States Patent
Erstad et al.

(10) Patent No.: US 7,451,384 B2
(45) Date of Patent: Nov. 11, 2008

(54) ERROR RECOVERY IN ASYNCHRONOUS COMBINATIONAL LOGIC CIRCUITS

(75) Inventors: David O. Erstad, Minnetonka, MN (US); Roy M. Carlson, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 883 days.

(21) Appl. No.: 10/891,654

(22) Filed: Jul. 15, 2004

(65) Prior Publication Data

US 2006/0033523 A1 Feb. 16, 2006

(51) Int. Cl.
*G06F 11/08* (2006.01)
(52) U.S. Cl. ............... 714/797; 714/789; 365/181; 326/35
(58) Field of Classification Search .............. 714/797, 714/789; 365/181; 326/35
See application file for complete search history.

(56) References Cited

U.S. PATENT DOCUMENTS

| | | | | |
|---|---|---|---|---|
| 4,074,851 A * | 2/1978 | Eichelberger et al. | ....... | 714/726 |
| 4,621,201 A | 11/1986 | Amdahl et al. | ............. | 307/219 |
| 4,782,467 A | 11/1988 | Belt et al. | ................. | 365/154 |
| 4,805,148 A | 2/1989 | Diehl-Nagle et al. | ........ | 365/154 |
| 4,920,515 A * | 4/1990 | Obata | .................... | 365/185.17 |
| 5,005,212 A * | 4/1991 | Wood | ......................... | 398/139 |
| 5,305,463 A | 4/1994 | Fant et al. | ................... | 395/800 |
| 5,317,726 A * | 5/1994 | Horst | .......................... | 714/12 |
| 5,406,513 A | 4/1995 | Canaris et al. | .............. | 365/181 |
| 5,430,764 A | 7/1995 | Chren, Jr. | ................... | 375/308 |
| 5,515,282 A * | 5/1996 | Jackson | ......................... | 701/4 |
| 5,550,731 A * | 8/1996 | Jackson | ........................ | 700/4 |
| 5,586,071 A * | 12/1996 | Flora | ........................... | 708/626 |
| 5,640,105 A | 6/1997 | Sobelman et al. | ............. | 326/36 |
| 5,652,902 A | 7/1997 | Fant | .......................... | 395/800 |
| 5,656,948 A | 8/1997 | Sobelman et al. | ............. | 326/35 |
| 5,664,211 A | 9/1997 | Sobelman et al. | ........... | 395/141 |
| 5,664,212 A | 9/1997 | Fant et al. | .................... | 395/141 |
| 5,751,726 A * | 5/1998 | Kim | .......................... | 714/709 |
| 5,764,081 A | 6/1998 | Fant et al. | ...................... | 326/63 |
| 5,793,662 A | 8/1998 | Duncan et al. | .............. | 364/768 |
| 5,796,962 A | 8/1998 | Fant et al. | .................... | 395/306 |
| 5,822,228 A * | 10/1998 | Irrinki et al. | ................. | 714/718 |
| 5,828,228 A | 10/1998 | Fant et al. | ..................... | 326/35 |
| 5,896,541 A | 4/1999 | Fant et al. | .............. | 395/800.18 |
| 5,907,693 A | 5/1999 | Fant et al. | ................... | 395/384 |
| 5,912,901 A * | 6/1999 | Adams et al. | ............... | 714/733 |
| 5,917,834 A * | 6/1999 | Arkin | .......................... | 714/724 |
| 5,930,522 A | 7/1999 | Fant | ..................... | 395/800.25 |

(Continued)

OTHER PUBLICATIONS

Slivinsky et al., Monitoring and Voting in Asynchronous Sampling, Jan. 1985, IEEE, vol. AES-21, No. 7, pp. 92-99.*

(Continued)

*Primary Examiner*—Mujtaba K Chaudry (57) ABSTRACT

A system and method for providing error recovery to an asynchronous logic circuit is presented. The asynchronous logic circuit with error recovery may use temporal redundancy to compare the results of an asynchronous computation and initiate error recovery if necessary. Outputs of the asynchronous logic circuit are compared using a plurality of asynchronous register voters. If an asynchronous register voter detects an inconsistent result, the asynchronous register voter clears itself. A majority of common data outputs from the plurality of asynchronous register voters is provided as an output that is representative of the output of the asynchronous logic circuit.

24 Claims, 6 Drawing Sheets

U.S. PATENT DOCUMENTS

| | | | | |
|---|---|---|---|---|
| 5,977,663 | A | 11/1999 | Fant et al. | 307/251 |
| 5,986,466 | A | 11/1999 | Sobelman et al. | 326/39 |
| 6,020,754 | A | 2/2000 | Sobelman et al. | 326/35 |
| 6,031,390 | A | 2/2000 | Fant et al. | 326/36 |
| 6,043,674 | A | 3/2000 | Sobelman | 326/35 |
| 6,052,770 | A | 4/2000 | Fant | 712/14 |
| 6,128,678 | A | 10/2000 | Masteller | 710/52 |
| 6,262,593 | B1 | 7/2001 | Sobelman et al. | 326/35 |
| 6,278,287 | B1 | 8/2001 | Baze | 326/9 |
| 6,292,128 | B1 | 9/2001 | Tsui et al. | 342/13 |
| 6,308,229 | B1 | 10/2001 | Masteller | 710/52 |
| 6,313,660 | B1 | 11/2001 | Sobelman et al. | 326/39 |
| 6,326,809 | B1 | 12/2001 | Gambles et al. | 326/46 |
| 6,327,607 | B1 | 12/2001 | Fant | 709/201 |
| 6,333,640 | B1 | 12/2001 | Fant et al. | 326/35 |
| 6,526,542 | B2 | 2/2003 | Kondratyev | 716/2 |
| 6,667,520 | B1 | 12/2003 | Fulkerson | 257/369 |
| 2002/0074609 | A1 | 6/2002 | Maruyama | 257/390 |
| 2003/0091038 | A1 | 5/2003 | Hagedorn | 370/359 |

OTHER PUBLICATIONS

Maher, Michael, "Radiation Design Considerations Using CMOS Logic," National Semiconductor Application Note 926, Jan. 1994.

"Throw Away the Clock," Theseus Logic—Benefits of NCL—EMI, http://www.theseus.com/_AboutNCL.htm, printed Nov. 19, 2002.

Sobelman, Gerald E. and Karl Fant, "CMOS Circuit Design of Threshold Gates with Hysteresis,", date unknown.

Fant, Karl M. and Scott A. Brandt, "NULL Convention Logic," Theseus Logic: Setting the Standard for Clockless Systems, 1997.

International Search Report for PCT/US2005/024838 dated Nov. 15, 2005.

* cited by examiner

ERROR RECOVERY IN ASYNCHRONOUS COMBINATIONAL LOGIC CIRCUITS

FIELD

The present invention relates generally to asynchronous combinational logic circuits, and more particularly, relates to error recovery in asynchronous combinational logic circuits.

BACKGROUND

Most digital circuits are synchronous in nature, meaning that a clock signal controls data flow through the circuit. As clock speeds increase, circuit design becomes more complex due to timing requirements. Problems related to high clock speeds include switching noise, peak currents on power rails, and unnecessary power consumption due to the switching noise. As a result of the problems encountered with synchronous circuit design, asynchronous design techniques have received more attention.

One such asynchronous approach is null convention logic (NCL). NCL is a clock-free delay-insensitive logic design methodology for digital systems. NCL uses a combination of multi-wire data representation and a control/signaling protocol. NCL circuits switch between a data representation of DATA and a control representation of NULL. Typically, DATA corresponds to a logic-1 level, while NULL corresponds to a logic-0 level. The separation between data and control representations provides self-synchronization, without the use of a clock signal.

The use of asynchronous circuit designs, such as NCL, may be advantageous in space, weapons, and aviation applications. However, these applications expose circuits to radiation. Radiation may take the form of alpha and energetic particles, as well as in other forms, such as gamma rays. Alpha particles are the byproducts of the natural decay of elements. Energetic particles include heavy ions, protons, neutrons, and electrons, which are abundant in space, even at commercial flight altitudes.

Radiation can cause transient disturbances, or glitches, in asynchronous circuit designs. When an energetic particle strikes a transistor region, a parasitic conduction path can be created, which may cause a false transition. The false transition, or glitch, can propagate through the circuit and may ultimately result in the disturbance of a state node containing state information, such as an output of a latch, register, or gate. The disturbance of a state node is commonly referred to as a single even upset (SEU). SEU is a specific class of transient fault. Other sources of transient faults exist and may have similar effects.

The circuit implementation of the basic NCL building block gate uses a latch element that is sensitive to upset due to transient disturbances caused by radiation. Many of these gates may be used in the design of asynchronous combinational logic circuits. Therefore, it would be beneficial to provide error recovery to an asynchronous combinational logic circuit that has been upset due to the transient disturbances. As a result of the error recovery, the asynchronous combinational logic circuit may be used in applications in which radiation is present.

BRIEF DESCRIPTION OF THE DRAWINGS

Exemplary embodiments are described below in conjunction with the appended drawing figures, wherein like reference numerals refer to like elements in the various figures, and wherein.

DETAILED DESCRIPTION

Figure 1:
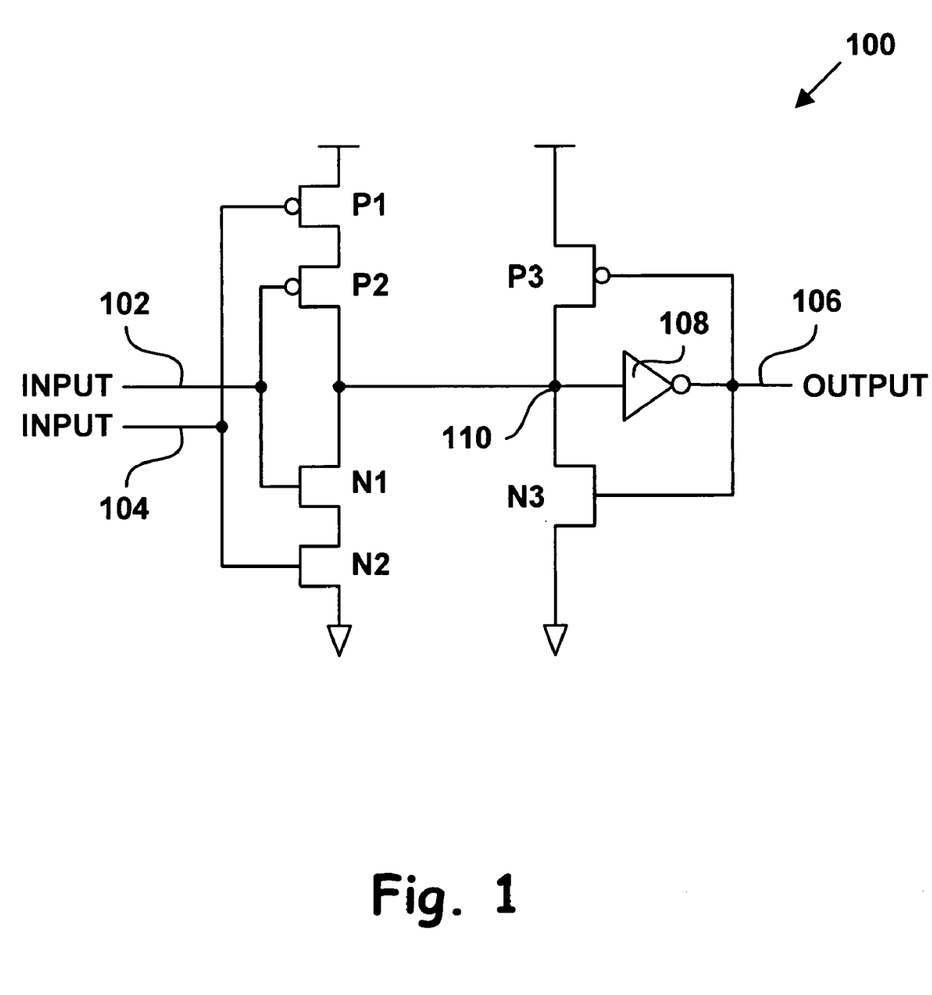
FIG. 1 is a schematic diagram of a typical NCL gate circuit, according to an exemplary embodiment.

FIG. 1 is a schematic diagram of a typical NCL gate circuit 100. The NCL gate circuit 100 shown in FIG. 1 has two inputs 102, 104. However, the NCL gate circuit 100 may have more than two inputs. The inputs 102, 104 can be at two different states, referred to as DATA and NULL. Typically, DATA corresponds to a logic-1 voltage level, while NULL corresponds to a logic-0 voltage level. For example, the logic-1 level may be approximately 5 volts, while the logic-0 level may be approximately 0 volts. However, other mappings of DATA and NULL are possible.

The NCL gate circuit 100 is shown in FIG. 1 as having a single output 106. However, the NCL gate circuit 100 may have more than one output. The output 106 can also be at two different states, DATA and NULL. If the output 106 is in a NULL state, then the output 106 may remain in the NULL state until a specified number of inputs (two inputs in this example) are placed in the DATA state. Once the output 106 is placed in the DATA state, the output 106 may remain in this state until all of the inputs return to the NULL state. The NCL gate circuit 100 is known as a 2-of-2 gate, meaning that 2 out of 2 inputs need to be in the DATA state for the output to be placed in the DATA state. Otherwise, the output remains in the NULL state.

In this example, the NCL gate circuit 100 has two inputs 102, 104. An output of an NCL circuit with two inputs may remain in the NULL state until both inputs are placed in the DATA state. More specifically, the output 106 may remain in the NULL state until both inputs 102, 104 are placed in the DATA state. Additionally, once the output 106 reaches the DATA state, the output 106 will remain in the DATA state until both inputs 102, 104 are placed in the NULL state.

The NCL gate circuit 100 includes an input driver consisting of four transistors P1, P2, N1, and N2. Additionally, the NCL gate circuit 100 includes feedback transistors P3 and N3. The transistors P1, P2, P3, N1, N2, and N3 are depicted in FIG. 1 as complementary metal-oxide semiconductor (CMOS) transistors; however, other transistor types may be employed. P-type CMOS transistors may be used in a pull-up network (e.g., P1, P2, and P3.). N-type CMOS transistors may be used in a pull-down network (e.g., N1, N2, and N3.)

The NCL gate circuit 100 also includes an inverter 108. The inverter 108 may include a p-type transistor and an n-type transistor connected in series between power and ground. However, any combination of passive and active devices operable to convert a logic-0 input to a logic-1 output and convert a logic-1 input to a logic-0 output may be used.

Transistors P3 and N3 form a feedback loop with the inverter 108. The gates of the P3 and N3 transistors are connected to the output of the inverter 108. As a result, the inverter 108 may turn on either P3 or N3 depending on the output of the inverter 108. For example, if the output of the inverter 108 is a logic-0, P3 may turn on. Similarly, if the output of the inverter 108 is a logic-1, N3 may turn on.

When P3 is turned on, the input to the inverter 108 may be "weakly held" at a logic-1 level. When N3 is turned on, the input to the inverter 108 may be "weakly held" at a logic-0 level. The input to the inverter 108 may be described as weakly held because the impedance of the series combination of transistors N1 and N2 can overdrive P3 and pull node 110 to a logic-0 state if both inputs 102, 104 are at a logic-1. Likewise, the series combination of transistors P1 and P2 can overdrive N3 and pull node 110 to a logic-1 state in the presence of logic-0 levels on both inputs 102, 104. Accordingly, the feedback loop formed by the inverter 108, P3, and N3 may be described as a weak feedback loop.

If the inputs 102, 104 are originally placed in the NULL state, the transistors P1 and P2 in the pull-up network may turn on, while the transistors N1 and N2 in the pull-down network may turn off. This may cause the output 106 to be placed in the NULL state. If either the input 102 or the input 104 is then placed in the DATA state, transistor P3 may remain turned on, which may keep the output 106 in the NULL state. However, if both the inputs 102, 104 are placed in the DATA state, the transistors P1 and P2 in the pull-up network may turn off, while the transistors N1 and N2 in the pull-down network may turn on. This may cause the output 106 to be placed in the DATA state.

If the inputs 102, 104 are originally placed in the DATA state, the transistors P1 and P2 in the pull-up network may turn off, while the transistors N1 and N2 in the pull-down network may turn on. This may cause the output 106 to be placed in the DATA state. If either the input 102 or the input 104 is then placed in the NULL state, transistor N3 may remain turned on, which may keep the output 106 in the DATA state. However, if both the inputs 102, 104 are placed in the NULL state, the transistors P1 and P2 in the pull-up network may turn on, while the transistors N1 and N2 in the pull-down network may turn off. This may cause the output 106 to be placed in the NULL state.

Figure 2:
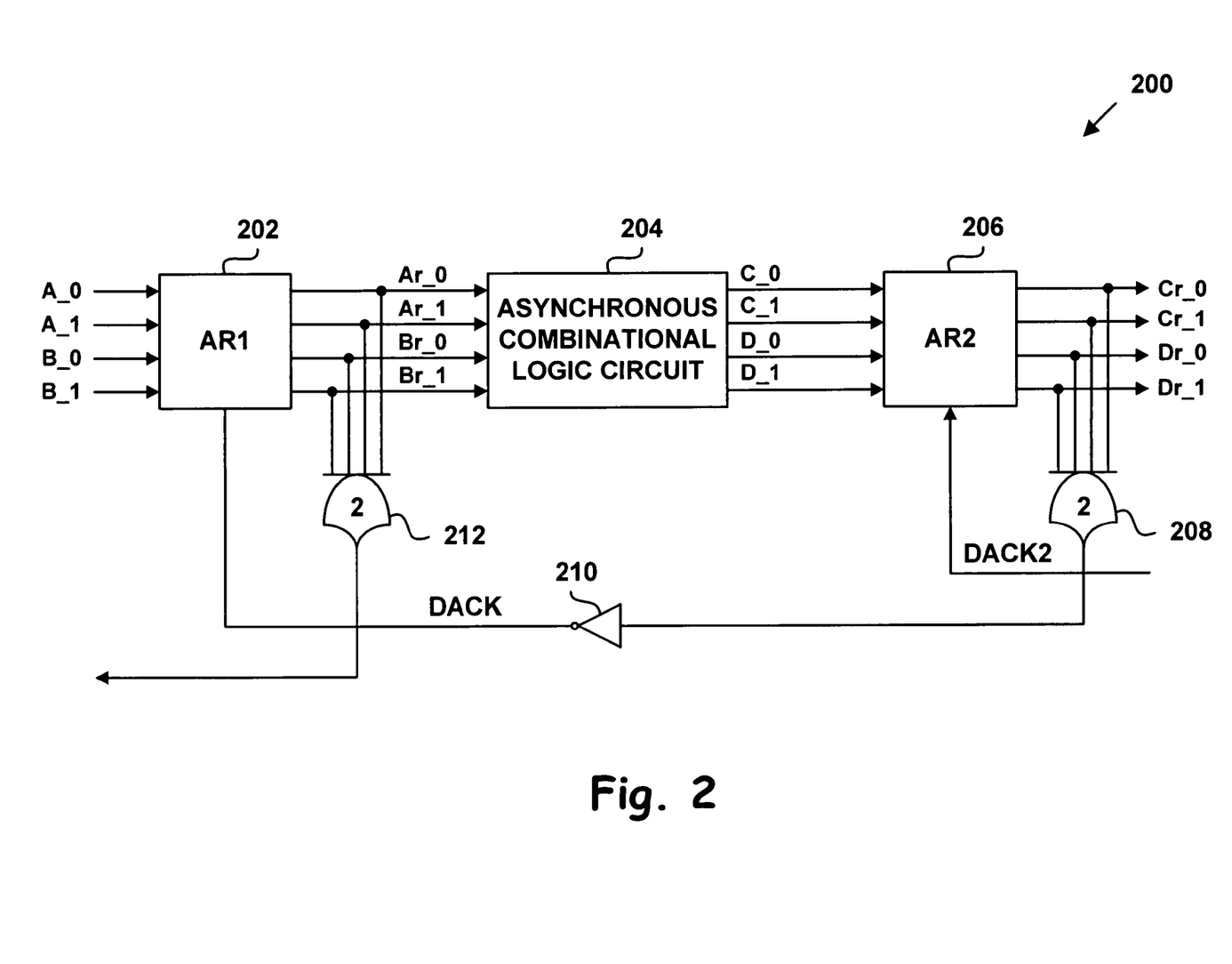
FIG. 2 is a schematic diagram of a typical NCL circuit, according to an exemplary embodiment.

FIG. 2 is a schematic diagram of a typical NCL circuit 200. The NCL circuit 200 includes an asynchronous combinational logic circuit 204 connected between a first asynchronous register (AR1) 202 and a second asynchronous register (AR2) 206. The outputs of the first and second asynchronous registers 202, 206 may be fed back to a previous asynchronous register through a feedback gate, such as feedback gates 208, 212, and an inverter, such as inverter 210. FIG. 2 depicts one stage of a typical NCL circuit. It is understood that additional stages having the same or different asynchronous combinational logic circuits may be included as part of an NCL circuit design.

The asynchronous combinational logic circuit 204 may include any combination of NCL gates that can be used to perform a variety of logic functions. Typically, each asynchronous combinational logic circuit 204 in an NCL circuit 200 has a first asynchronous register 202 at its input and a second asynchronous register 206 at its output. The first and second asynchronous registers 202, 206 may store data. Additionally, the first and second asynchronous registers 202, 206 may monitor whether the asynchronous combinational logic circuit 204 is ready to accept new data. Once the asynchronous combinational logic circuit 204 indicates that it is ready to accept new data, data on the inputs of the first asynchronous register 202 may be stored in the first asynchronous register 202 and be provided to the asynchronous combinational logic circuit 204.

In the NCL circuit 200, a data state may be represented by two electrical signals, such as outputs C_0 and C_1 of the asynchronous combinational logic circuit 204. Taken together, the two electrical signals may represent one binary data value. The NCL circuit 200 may be designed such that permissible data states may include NULL (e.g., C_0=logic-0, C_1=logic-0), DATA0 (e.g., C_0=logic-1, C_1=log C_0=logic-0, C_1=logic-1). The fourth possible state may be an ERROR state (e.g., C_0=logic-1, C_1=logic-1). The ERROR state may occur as a result of a transient fault, such as an SEU. Accordingly, the output pairs of the NCL circuit 200 (e.g., C_0 and C_1) may be considered as mutually exclusive.

When a complete data set has been received from the asynchronous combinational logic circuit 204 and stored by the second asynchronous register 206, the second asynchronous register 206 may provide as an output DATA. When all of the outputs of the second asynchronous register 206 have transitioned to a DATA state and the feedback gate 208 receives the DATA, the feedback gate 208 provides a logic-1 output. For example, in FIG. 2 when Cr and Dr are both in the DATA state, then at least two of the four electrical signals Cr_0, Cr_1, Dr_0, and Dr_1 are in the logic-1 state. The feedback gates 208, 212 are 2-of-4 NCL gates meaning that when at least two of the four electrical signals reach the logic-1 state, the output of the feedback gates 208, 212 may change to the logic-1 (DATA) state.

The inverter 210 may convert the logic-1 value at the output of the feedback gate 208 to a logic-0 value, providing a data acknowledge (DACK) signal to the first asynchronous register 202. In this example, the DACK signal is active low. The DACK signal may indicate to the first asynchronous register 202 that the asynchronous combinational logic circuit 204 is ready to receive a NULL wave front. The NULL wave front may occur when all the inputs to the asynchronous combinational logic circuit 204 and the DACK signal are at a logic-0 level. In other words, A_0, A_1, B_0, B_1, and the DACK signal are at a logic-0 level in order to propagate a NULL wave front.

The feedback gate 208 may continue to output a logic-1 value until all of its input values are NULL, which means that the second asynchronous register 206 has received and stored all NULL values. When the feedback gate 208 receives the NULL wave front, the feedback gate 208 provides a logic-0 output. The inverter 210 converts the logic-0 value to a logic-1 value, which provides a logic-1 DACK signal to the first asynchronous register 202. The DACK signal may indicate to the first asynchronous register 202 that the asynchronous combinational logic circuit 204 is ready to receive a DATA wave front. The DATA wave front may occur when all the inputs to the asynchronous combinational logic circuit 204 contain DATA (e.g., DATA0 and DATA1) and the DACK signal is at a logic-1 level. For example, when A and B have both entered the data state and DACK reaches a logic-1 level, then the DATA wave front may propagate to the output of the first asynchronous register 202 and through the asynchronous combinational logic circuit 204.

Figure 3:
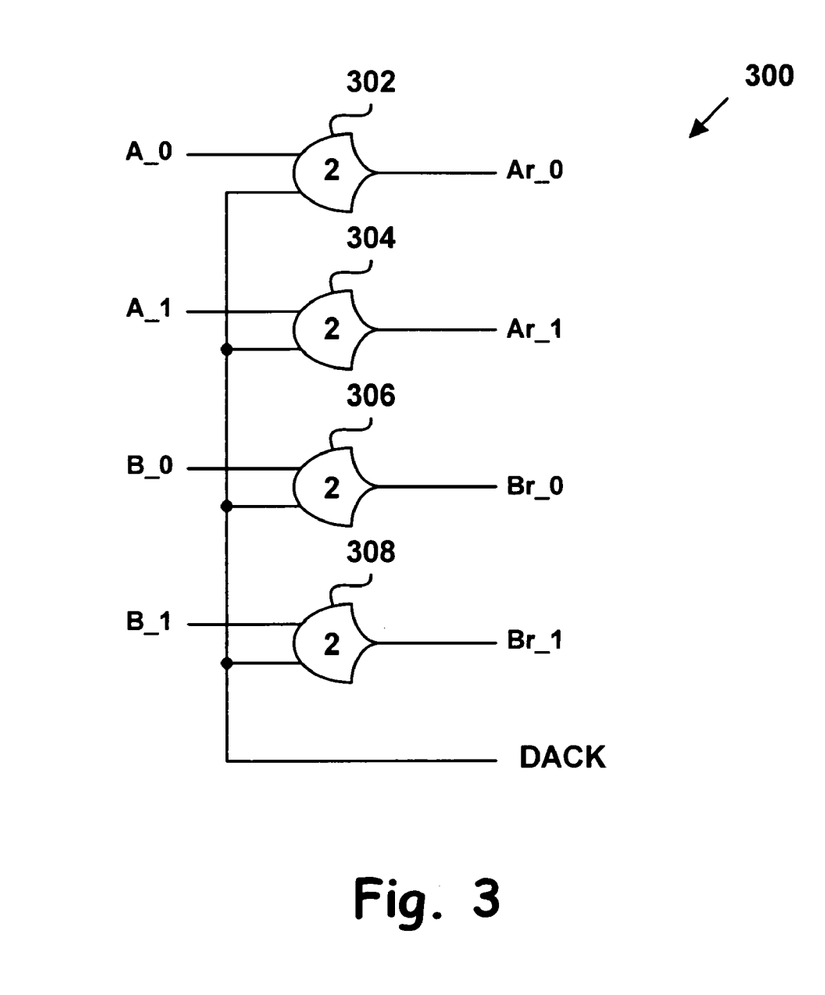
FIG. 3 is a schematic diagram of an asynchronous register, according to an exemplary embodiment.

FIG. 3 is a schematic diagram of an asynchronous register 300. The asynchronous register 300 may be substantially the same as the asynchronous registers 202, 206 depicted in FIG. 2. The asynchronous register 300 may include a bank of 2-of-2 NCL gates 302-308. The gates 302-308 are known as 2-of-2 NCL gates meaning that the output is designed to transition to the DATA state if both of the two inputs are in the DATA state. While four gates 302-308 are depicted in FIG. 3, the asynchronous register 300 may have more or less than four gates. The number of inputs to the asynchronous register 300 may determine the number of gates in the asynchronous register 300, but other asynchronous register designs may also be used.

In this example, each gate 302-308 in the asynchronous register 300 may have two inputs and one output. One input to each of the gates 302-308 may be a data input (e.g., A_0, A_1, B_0, and B_1), while the second input to each of the gates 302-308 may be a control input (e.g., DACK). For example, the DACK signal may be the output of inverter 210 depicted in FIG. 2. Each of the outputs of the gates 302-308 may be a registered data output (e.g., Ar_0, Ar_1, Br_0, and Br_1). It is understood that the asynchronous register 300 may include additional inputs and outputs.

The control signal, DACK, may indicate that the second asynchronous register 206 has received and stored DATA from the asynchronous combinational logic circuit 204 and is ready to receive a NULL wave front. This indication may be a result of the feedback gate 208 receiving the DATA input and providing a logic-1 output, which is then converted to a logic-0 by the inverter 210. The logic-0 DACK signal is then provided to the asynchronous register 300. When all inputs to each NCL gate in the bank of gates 302-308 are in the NULL state, the NULL wave front may be transferred to the asynchronous combinational logic circuit 204.

Similarly, the DACK signal equals logic-1 this may indicate that the second asynchronous register 206 has received and stored NULL from the asynchronous combinational logic circuit 204 and is ready to receive a DATA wave front. This indication may be a result of the feedback gate 208 receiving the NULL input and providing a logic-0 output, which is then converted to a logic-1 by the inverter 210. The logic-1 DACK signal is then provided to the asynchronous register 300. When the inputs to the bank of gates 302-308 are in the DATA state, the DATA wave front may be transferred to the asynchronous combinational logic circuit 204.

If the NCL circuit 200 is used in applications that expose the circuit to radiation, the radiation may cause a transient fault, such as an SEU. The SEU may cause the outputs of the asynchronous combinational logic circuit 204 to be placed in a NULL or DATA state independently from the states on the inputs. As a result, erroneous data may propagate to a circuit connected to the NCL circuit 200. Therefore, it would be beneficial to provide error recovery to the asynchronous combinational logic circuit 204.

To provide error recovery to the asynchronous combinational logic circuit 204, temporal redundancy may be used to verify the results of the computational logic circuit 204. If the verification detects erroneous data at the output of the asynchronous combinational logic circuit 204, a reset of the asynchronous combinational logic circuit 204 may be performed. The asynchronous combinational logic circuit 204 may reset itself based on the data inputs provided by the first asynchronous register 202.

Figure 4:
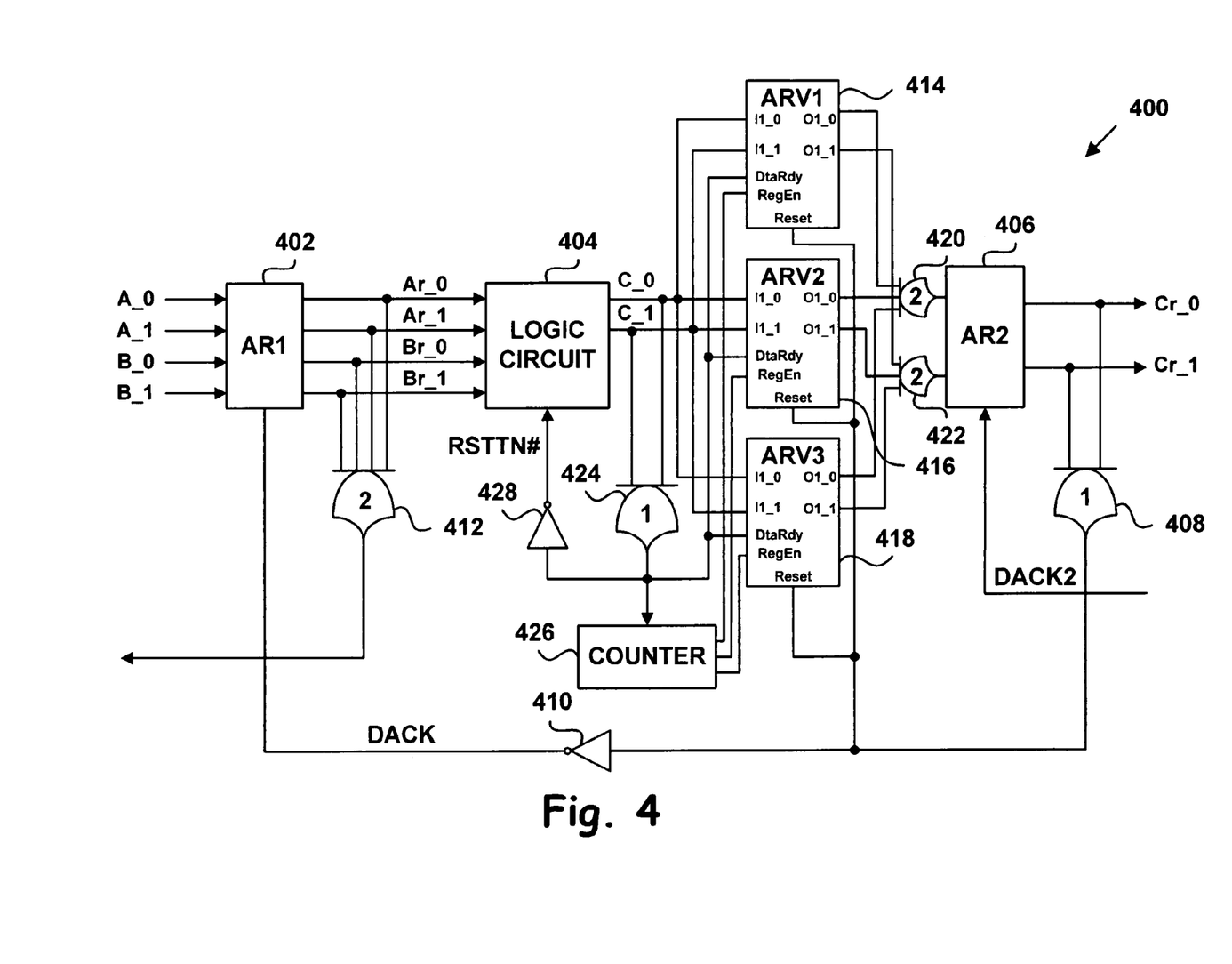
FIG. 4 is a schematic diagram of an NCL circuit with error recovery, according to an exemplary embodiment.

FIG. 4 is a schematic diagram of an NCL circuit with error recovery 400, according to an exemplary embodiment. FIG. 4 shows only the C_0 and C_1 outputs of the asynchronous combinational logic circuit 404 to simplify the circuit diagram. It is understood that the asynchronous combinational logic circuit 404 also provides the D_0 and D_1 outputs and that these outputs are similarly connected to circuitry as depicted in FIG. 4 with respect to C_0 and C_1.

The NCL circuit with error recovery 400 is similar to the typical NCL circuit 200 depicted in FIG. 2; however, additional error recovery circuitry has been added. Similar to the NCL circuit 200, the NCL circuit with error recovery 400 includes an asynchronous combinational logic circuit 404 located between a first asynchronous register 402 and a second asynchronous register 406. Additionally, the outputs of the first and second asynchronous registers 402, 406 may be fed back to the previous asynchronous register through a feedback gate, such as feedback gates 408, 412. Additionally, the inverter 410 may provide an active low DACK signal to the first asynchronous register 402.

The NCL circuit with error recovery 400 may also include three asynchronous register voters (ARV1-ARV3) 414-418, a counter 426, voter gates 420, 422, a data ready gate 424, and an inverter 428. More or less than three asynchronous register voters may also be used. Additionally, more or less than two voter gates may be used. The number of voter gates may be determined by the number of outputs of the asynchronous combinational logic circuit 404. For example, if all four outputs (C_0, C_1, D_0, and D_1) were depicted in FIG. 4, four voter gates may be used.

The voter gates 420, 422 and the data ready gate 424 may be NCL gates. The voter gates 420, 422 may be 2-of-3 NCL gates meaning that the output is designed to transition to the DATA state if at least two of the three inputs are in the DATA state. The data ready gate 424 may be a 1-of-2 NCL gate meaning that the output is designed to transition to the DATA state if at least one of the two inputs is in the DATA state. However, the data ready gate 424 may be modified according to the number of outputs of the asynchronous combinational logic circuit 404. For example, if all four outputs (C_0, C_1, D_0, and D_1) were depicted in FIG. 4, the data ready gate 424 may be a 2-of-4 NCL gate.

Additionally, the circuitry within the asynchronous combinational logic circuit 404 may be modified to be resettable as described with reference to FIG. 5. The feedback gate 408 may be modified according to the number of outputs of the asynchronous combinational logic circuit 404. The feedback gate 408 is depicted in FIG. 4 as a 1-of-2 NCL gate. However, if all four outputs were depicted in FIG. 4, the feedback gate 408 may be a 2-of-4 NCL gate.

The outputs of the asynchronous combinational logic circuit 404 may be connected to the data ready gate 424 and the three asynchronous register voters 414-418. An output of the data ready gate 424 may be connected to the inverter 428, the counter 426, and the three asynchronous register voters 414-418. The data ready gate 424 may detect whether a DATA or NULL wave front has propagated through the asynchronous combinational logic circuit 404. When the data ready gate 424 detects a DATA wave front, the data ready gate 424 may provide a logic-1 output. When the data ready gate 424 detects a NULL wave front, the data ready gate 424 may provide a logic-0 output.

If the data ready gate 424 detects a DATA wave front, the inverter 428 may convert the logic-1 output from the data ready gate 424 and provide a logic-0 Reset to NULL (RSTTN#) output signal to the asynchronous combinational logic circuit 404. The logic-0 RSSTN# signal may cause a NULL wave front to propagate through the asynchronous combinational logic circuit 404, which is explained in more detail with reference to FIG. 5. After the NULL wave front propagates through the asynchronous combinational logic circuit 404, the asynchronous combinational logic circuit 404 may reset itself based on the data inputs provided by the first asynchronous register 402.

The data ready gate 424 may also provide an input to the counter 426. The counter 426 may have one input and three outputs. The counter 426 may be initialized to provide a logic-0 output (i.e., counter out=000). One of the three outputs might be selected to provide a logic-1 output signal at an input transition from a logic-0 to a logic-1. As the input to the counter 426 transitions from a logic-0 to a logic-1, the counter 426 may provide a count-to-three output.

For example, at the first input transition from a logic-0 to a logic-1, the first output may transition from a logic-0 to a logic-1 (i.e., counter out=001). At a second input transition from a logic-0 to a logic-1, the first output may transition from a logic-1 to a logic-0 and the second output may transition from a logic-0 to a logic-1 (i.e., counter out=010). At a third input transition from a logic-0 to a logic-1, the second output may transition from a logic-1 to a logic-0 and the third output may transition from a logic-0 to a logic-1 (i.e., counter out=100). The counter 426 may continue selecting one of the three outputs in this manner as the input continues to transition from a logic-0 to a logic-1.

A first output from the counter 426 may be connected to the RegEn input of the first asynchronous register voter 414. A second output from the counter 426 may be connected to the RegEn input of the second asynchronous register voter 416. A third output from the counter 426 may be connected to the RegEn input of the third asynchronous register voter 418. The RegEn input may indicate whether or not a particular asynchronous register voter 414-418 has been selected to receive the data for a particular data occurrence. A logic-1 value provided to the RegEn input may indicate that the asynchronous register voter 414-418 has been selected, while a logic-0 value provided to the RegEn input may indicate that the asynchronous register voter 414-418 has not been selected. The counter 426 may operate to select one of the three asynchronous register voters 414-418 to receive the data from the asynchronous combinational logic circuit 404 for each data occurrence.

The data ready gate 424 may also provide a DtaRdy input to the asynchronous register voters 414-418. The DtaRdy input may indicate to the asynchronous register voters 414-418 that data is ready at data inputs to the asynchronous register voters 414-418 (e.g., I1_0, I1_1). A logic-1 value provided to the DtaRdy input may indicate that data is ready at the data inputs to the asynchronous register voters 414-418, while a logic-0 value provided to the DtaRdy input may indicate that data is not ready at the data inputs to the asynchronous register voters 414-418.

The asynchronous register voters 414-418 may receive data inputs from the asynchronous combinational logic circuit 404. Additionally, the asynchronous register voters 414-418 may receive three control inputs. As described previously, the asynchronous register voters 414-418 may receive the RegEn input from the counter 426 and the DtaRdy input from the data ready gate 424. In addition, the asynchronous register voters 414-418 may receive a Reset signal from the output of the feedback gate 408. The asynchronous register voters 414-418 are described in more detail below with reference to FIG. 6.

The feedback gate 408 may detect whether a DATA or NULL wave front has propagated through the second asynchronous register 406. When the feedback gate 408 detects a DATA wave front, the feedback gate 408 may provide a logic-1 Reset output. When the feedback gate 408 detects a NULL wave front, the feedback gate 408 may provide a logic-0 Reset output. A logic-1 Reset signal may clear the asynchronous register voters 414-418 causing the asynchronous register voters 414-418 to provide a NULL output.

The asynchronous register voters 414-418 may provide data outputs (e.g., O1_0, O1_1) to the voter gates 420, 422. All the O1_0 outputs may be connected to inputs of the voter gate 420, while all the O1_1 outputs may be connected to inputs of the voter gate 422. The voter gates 420, 422 may provide a voting mechanism. If two of the three inputs to the voter gates 420, 422 have the same logic value, that logic value may propagate through the second asynchronous register 406.

The outputs of the voter gates 420, 422 may be connected to the second asynchronous register 406. If at least two of the three inputs to the first voter gate 420 and the DACK2 signal are at a logic-1 level, the Cr_0 output of the second asynchronous register 406 may transition to a logic-1 level. Similarly, if at least two of the three inputs to the second voter gate 422 and the DACK2 signal are at a logic-1 level, the Cr_1 output of the second asynchronous register 406 may transition to a logic-1 level. As described previously, if either Cr_0 or Cr_1 are at a logic-1 level, the output of the feedback gate 408 may transition to a logic-1 level, resetting the asynchronous register voters 414-418.

If at least two of the three inputs to the first voter gate 420 and the DACK2 signal are at a logic-0 level, the Cr_0 output of the second asynchronous register 406 may transition to a logic-0 level. Similarly, if at least two of the three inputs to the second voter gate 422 and the DACK2 signal are at a logic-0 level, the Cr_1 output of the second asynchronous register 406 may transition to a logic-0 level.

In operation, the NCL circuit with error recovery 400 may use temporal redundancy to compare the results of an asynchronous computation and initiate error recovery if a transient fault is detected. The asynchronous combinational logic circuit 404 performs an initial computation based on the inputs provided by the first asynchronous register 402. After the asynchronous combinational logic circuit 404 provides data outputs, the counter 426 selects the first asynchronous register voter 414 to receive the data outputs and the asynchronous combinational logic circuit 404 is reset, causing a NULL wave front to propagate through the asynchronous combinational logic circuit 404. If the first asynchronous register voter 414 detects an inconsistent result (i.e., the ERROR state), the first asynchronous register voter 414 clears itself, providing a NULL output. Otherwise, the first asynchronous register voter 414 provides a DATA output based on the output of the asynchronous combinational logic circuit 404.

The asynchronous combinational logic circuit 404 may reset itself based on the inputs provided by the first asynchronous register 402. After the asynchronous combinational logic circuit 404 provides the outputs resulting from DATA propagation following the reset, the counter 426 selects the second asynchronous register voter 416 to receive the outputs resulting from DATA propagation following reset. If the second asynchronous register voter 416 detects an inconsistent result, the second asynchronous register voter 416 clears itself, providing a NULL output. Otherwise, the second asynchronous register voter 416 provides a DATA output based on the reset output of the asynchronous combinational logic circuit 404.

The voter gates 420, 422 compare the outputs of the first and second asynchronous register voters 414, 416. If the outputs are at the same logic level, the outputs of the voter gates 420, 422 are provided as inputs to the second asynchronous register 406. The second asynchronous register 406 may provide an output according to the state of the DACK2 input. If the inputs to the second asynchronous register 406 and the DACK2 signal are all at a NULL state, the second asynchronous register 406 may provide a NULL wave front to a circuit connected to the NCL circuit with error recovery 400. If the inputs to the second asynchronous register 406 are in a DATA state and the DACK2 signal is at a logic-1 level, the second asynchronous register 406 may provide a DATA wave front to a circuit connected to the NCL circuit with error recovery 400.

If the outputs of the first and second asynchronous register voters 414, 416 are not at the same logic level, the asynchronous combinational logic circuit 404 may reset itself a second time based on the inputs provided by the first asynchronous register 402. After the asynchronous combinational logic circuit 404 provides the outputs resulting from DATA propagation following the second reset, the counter 426 selects the third asynchronous register voter 418 to receive the outputs from DATA propagation following the second reset. If the third asynchronous register voter 418 detects a transient fault, the third asynchronous register voter 418 clears itself, providing a NULL output. Otherwise, the third asynchronous register voter 418 provides a DATA output based on the second reset output of the asynchronous combinational logic circuit 404. The voter gates 420, 422 compare the outputs of the asynchronous register voters 414-418. The voter gates 420, 422 may provide as an output the logic state of the majority of its inputs. If two of the three inputs to the voter gates 420, 422 are at a logic-0 level, the voter gates 420, 422 may provide a logic-0 output to the second asynchronous register 406. If two of the three inputs to the voter gates 420, 422 are at a logic-1 level, the voter gates 420, 422 may provide a logic-1 output to the second asynchronous register 406. Accordingly, the asynchronous voter registers 414-418 and the voter gates 420, 422 may prevent erroneous data from entering into the second asynchronous register 406.

The second asynchronous register 406 may provide an output according to the state of the DACK2 input. If the inputs to the second asynchronous register 406 and the DACK2 signal are all at a NULL state, the second asynchronous register 406 may provide a NULL wave front to a circuit connected to the NCL circuit with error recovery 400. If the inputs to the second asynchronous register 406 are in a DATA state and the DACK2 signal is at a logic-1 level, the second asynchronous register 406 may provide a DATA wave front to a circuit connected to the NCL circuit with error recovery 400.

Figure 5:
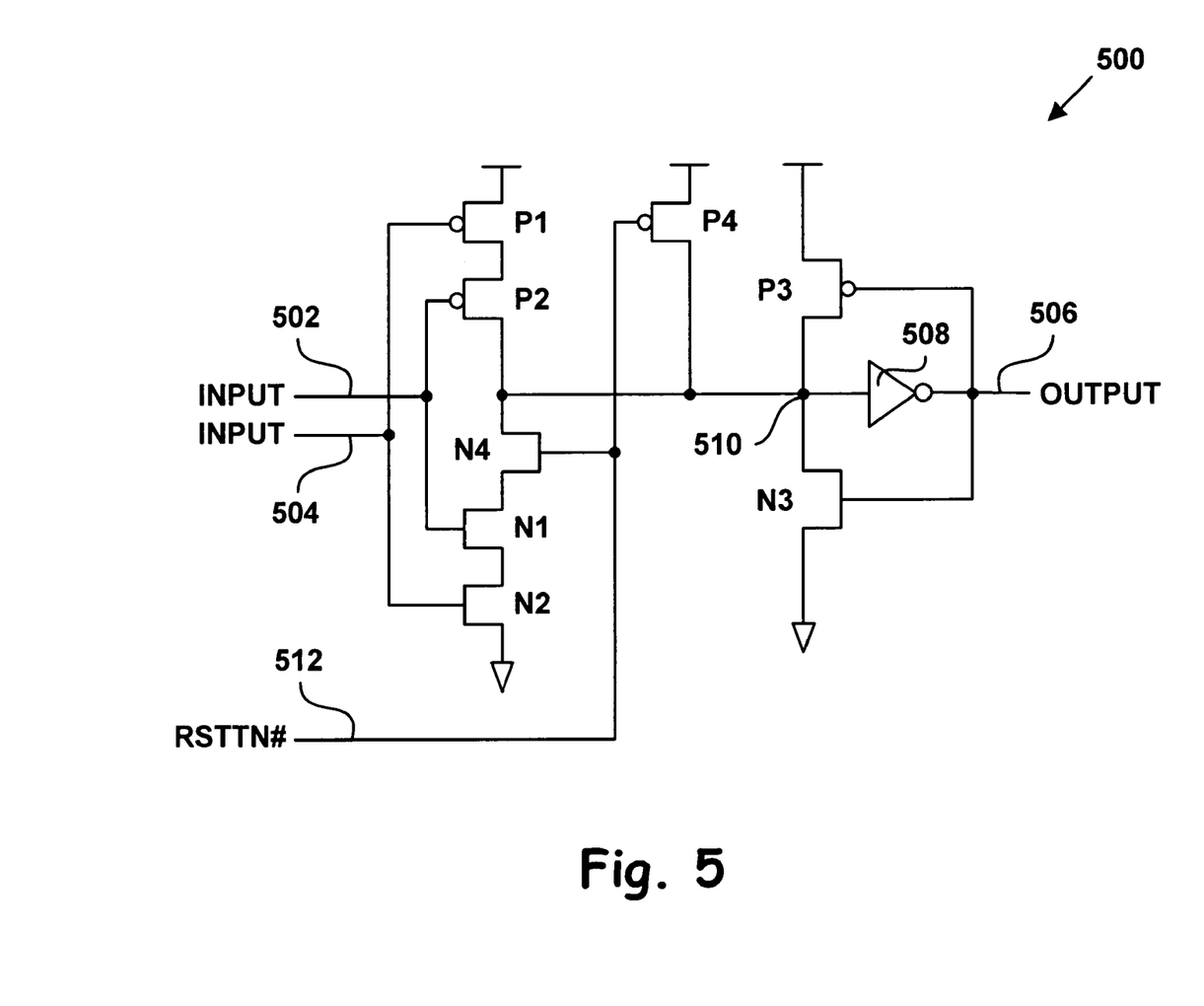
FIG. 5 is a schematic diagram of a resettable NCL gate circuit, according to an exemplary embodiment.

FIG. 5 is a schematic diagram of a resettable NCL gate circuit 500, according to an exemplary embodiment. The resettable NCL gate circuit 500 is similar to the NCL gate circuit 100 described above with reference to FIG. 1. However, the resettable NCL gate circuit 500 includes two additional transistors, P4 and N4, and receives one additional input, RSTTN# signal 512. The transistors P4 and N4 are depicted in FIG. 5 as CMOS transistors; however, other transistor types may be employed. The RSTTN# signal 512, which is an output of the inverter 428, may be connected to a gate of each the P4 and N4 transistors. The P4 transistor may be connected in the pull-up network between power and node 510, while the N4 transistor may be connected in the pull-down network between the N1 transistor and node 510.

When the RSTTN# signal 512 is at a logic-1 level, indicating that a NULL wave front has been detected, P4 may be turned off, while N4 may be turned on. As a result, the resettable NCL gate circuit 500 may operate in a similar manner as the typical NCL gate circuit 100. However, when the RSTTN# signal 512 is at a logic-0 level, indicating that a DATA wave front has been detected, the operation of the resettable NCL gate circuit 500 may be different than the operation of the typical NCL gate circuit 100. When the RSTTN# signal 512 is at a logic-0 level, P4 may be turned on, while N4 may be turned off. When N4 is turned off, transistors N1 and N2 may be prevented from pulling node 510 to a logic-0 level. Thus, P4 may pull node 510 to a logic-1 level.

For example, if the RSTTN# signal 512 is at a logic-0 level and the inputs 502, 504 are initially placed in the NULL state, the P1 and P2 transistors may turn on, while the N1 and N2 transistors may turn off. This may cause the output 506 to be placed in the NULL state. If either the input 502 or the input 504 is then placed in the DATA state, transistors P3 and P4 may remain turned on, which may keep the output 506 in the NULL state. However, if both the inputs 502, 504 are placed in the DATA state, the P1 and P2 transistors may turn off, while the N1 and N2 transistors may turn on. However, because N4 is turned off, the output 506 will not be placed in the DATA state. The P4 transistor may ensure that the output 506 remains in the NULL state while the RSTTN# signal 512 remains at a logic-0 level. As a result of the modifications to the resettable NCL gate circuit 500, a NULL wave front may propagate through the asynchronous combinational logic circuit 404, which may clear a fault, returning the RSTTN# signal 512 to a logic-1 level. The asynchronous combinational logic circuit 404 may reset itself to a valid data output based on the data inputs provided by the first asynchronous register 402.

Figure 6:
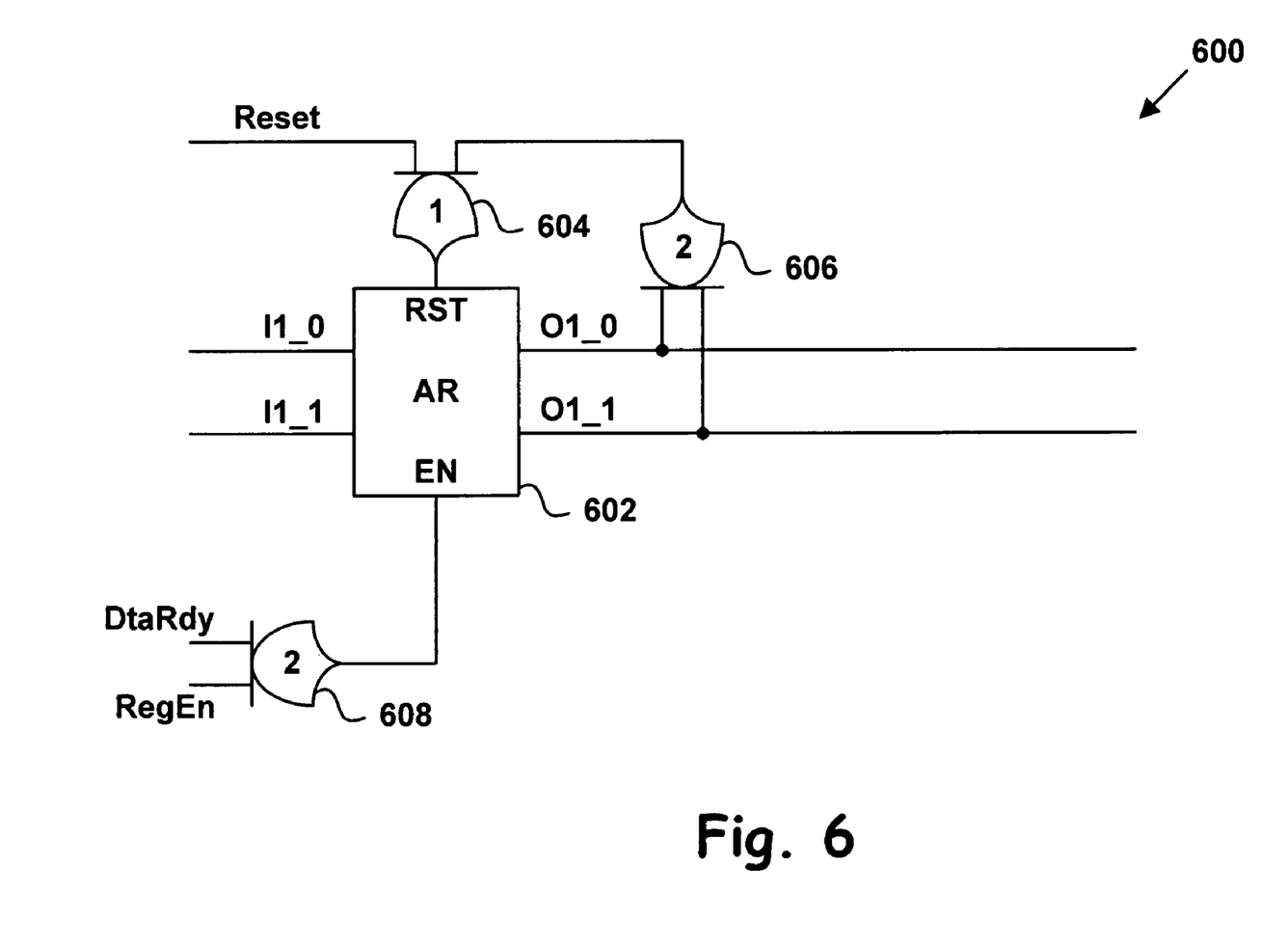
FIG. 6 is a schematic diagram of an asynchronous register voter, according to an exemplary embodiment.

FIG. 6 is a schematic diagram of an asynchronous register voter 600, according to an exemplary embodiment. The asynchronous register voter 600 may be substantially the same as the asynchronous register voters 414-418 depicted in FIG. 4. The asynchronous register voter 600 includes an asynchronous register 602 and three gates 604-608.

The asynchronous register 602 is similar to the asynchronous register 300 as depicted in FIG. 3, except that each gate in the bank of gates may be a 3-3 gate having two control inputs (e.g., EN and RST), in addition to the one data input. The output of the 3-3 NCL gate may transition to the DATA state if all of the three inputs are in the DATA state. The gate 604 may be a 1-2 NCL gate meaning that the output is designed to transition to the DATA state if at least one of the two inputs is in the DATA state. The gates 606, 608 may be 2-of-2 NCL gates meaning that the output is designed to transition to the DATA state if both of the two inputs are in the DATA state.

The first control input EN may be connected to an output of the gate 608. The gate 608 may have two inputs, DtaRdy and RegEn. The DtaRdy input may be an output of the data ready gate 424, while the RegEn input may be an output of the counter 426. The first control input EN may be at a logic-1 level when both the DtaRdy and RegEn inputs are at a logic-1 level. Otherwise, the first control input EN may be at a logic-0 level. When the first control input EN is at a logic-1 level, the asynchronous register voter 600 may be enabled. When the asynchronous register voter 600 is enabled, inputs (I1_0, I1_1) may be registered or latched into the asynchronous register voter 600. The latched inputs may propagate to the outputs (O1_0, O1_1) of the asynchronous register voter 600 depending on the state of the second control input RST.

The second control input RST may be connected to an output of the gate 604. The gate 604 may have two inputs. The first input to the gate 604 may be the Reset signal, which may be connected to an output of the feedback gate 408. As described above with reference to FIG. 4, the Reset signal may be at a logic-1 level when the feedback gate 408 detects a DATA wave front and at a logic-0 level when the feedback gate 408 detects a NULL wave front.

The second input to the gate 604 may be connected to an output of the gate 606. The gate 606 may detect whether a transient fault, such as an SEU, has occurred. If a fault occurs, which may be indicated by an ERROR state at the input to the gate 606, the gate 606 may provide a logic-1 level to the gate 604. Otherwise, the gate 606 may provide a logic-0 level to the gate 604. If either the Reset signal or the output of the gate 606 is at a logic-1 level, the second control input RST may be set to a logic-1. When the second control input RST is at a logic-1 level, the asynchronous register voter 600 may be cleared, resulting in a logic-0 output.

By modifying the typical NCL circuit as described above, the asynchronous combinational logic circuit 404 may be operable to recover from an error caused by a transient fault.

The asynchronous combinational logic circuit with error recovery circuitry may be able to detect and recover from an inconsistent result. As a result, the asynchronous combinational logic circuit may be used in applications in which radiation is present.

It should be understood that the illustrated embodiments are exemplary only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A system for providing error recovery to an asynchronous logic circuit, comprising in combination:
    a plurality of asynchronous register voters for receiving outputs from the asynchronous logic circuit, wherein the plurality of asynchronous register voters provide an output indicating a non-data state value if an inconsistent result is detected; and
    a plurality of voter gates for receiving an common input from each of the plurality of asynchronous register voters, wherein the plurality of voter gates compares the common inputs from each of the plurality of asynchronous register voters, wherein the plurality of voter gate provides an output having a same logic level as a majority of the common inputs from the plurality of asynchronous register voters, wherein the output from the plurality of voter gates is representative of the outputs from the asynchronous logic circuit.

2. The system of claim 1, wherein the asynchronous logic circuit is a null convention logic circuit.

3. The system of claim 1, wherein the plurality of asynchronous register voters includes an asynchronous register and a plurality of null conversion logic gates.

4. The system of claim 1, further comprising a means to cause a NULL wave front to propagate through the asynchronous logic circuit after detecting a DATA wave front.

5. The system of claim 4, wherein the means to cause a NULL wave front to propagate through the asynchronous logic circuit is a null convention logic gate connected to the outputs of the asynchronous logic circuit.

6. The system of claim 1, further comprising a counter operable to select one of the plurality of asynchronous register voters to latch the outputs of the asynchronous logic circuit.

7. The system of claim 1, wherein the plurality of voting gates are null convention logic gates.

8. The system of claim 1, wherein the inconsistent result is due to a single event upset.

9. A system for providing error recovery to an asynchronous logic circuit, comprising in combination:
    a first asynchronous register for providing inputs to the asynchronous logic circuit;
    a plurality of asynchronous register voters for receiving outputs from the asynchronous logic circuit, wherein the plurality of asynchronous register voters provide an output indicating a non-data state value if an inconsistent result is detected;
    a plurality of voter gates for receiving a common input from each of the plurality of asynchronous register voters, wherein the plurality of voter gates compares the common inputs from each of the plurality of asynchronous register voters, wherein the plurality of voter gates provide an output having a same logic level as a majority of the common inputs from the plurality of asynchronous register voters; and
    a second asynchronous register for receiving the outputs from the plurality of voter gates, wherein the second asynchronous register provides an output representative of the output of the asynchronous logic circuit, wherein inconsistent results are detected and corrected prior to the second asynchronous register providing the output.

10. The system of claim 9, wherein the asynchronous logic circuit is a null convention logic circuit.

11. The system of claim 9, wherein the first and second asynchronous register include a bank of null convention logic gates.

12. The system of claim 9, wherein the plurality of asynchronous register voters includes an asynchronous register and a plurality of null conversion logic gates.

13. The system of claim 9, further comprising a means to cause a NULL wave front to propagate through the asynchronous logic circuit after detecting a DATA wave front.

14. The system of claim 13, wherein the means to cause a NULL wave front to propagate through the asynchronous logic circuit is a null convention logic gate connected to the outputs of the asynchronous logic circuit.

15. The system of claim 13, wherein the asynchronous logic circuit resets itself using data from the first asynchronous register.

16. The system of claim 9, further comprising a counter operable to select one of the plurality of asynchronous register voters to latch the outputs of the asynchronous logic circuit.

17. The system of claim 9, wherein the plurality of voting gates are null convention logic gates.

18. The system of claim 9, wherein the inconsistent result is due to is a single event upset.

19. A method for providing error recovery to an asynchronous logic circuit, comprising in combination:
    detecting an inconsistent result;
    clearing an asynchronous register voter upon detection of the inconsistent result;
    comparing common data outputs of a plurality of asynchronous register voters; and
    providing an output of the asynchronous logic circuit based on a majority of the common data outputs from the plurality of asynchronous register voters.

20. The method of claim 19, wherein the asynchronous logic circuit is a null convention logic circuit.

21. The method of claim 19, wherein the inconsistent result is due to a single event upset.

22. The method of claim 19, wherein the plurality of asynchronous register voters includes an asynchronous register and a plurality of null conversion logic gates.

23. The method of claim 19, wherein a voter gate compares the common data outputs of the plurality of asynchronous register voters.

24. The method of claim 23, wherein the voter gate is a null convention logic gate.

* * * * *